United States Patent
Nguyen et al.

(10) Patent No.: US 12,490,479 B2
(45) Date of Patent: Dec. 2, 2025

(54) FIELD EFFECT TRANSISTOR HAVING A DIELECTRIC STRUCTURE

(71) Applicant: Infineon Technologies AG, Neubiberg (DE)

(72) Inventors: Chi Dong Nguyen, Munich (DE); Till Schlösser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 499 days.

(21) Appl. No.: 18/099,543

(22) Filed: Jan. 20, 2023

(65) Prior Publication Data
US 2023/0246068 A1 Aug. 3, 2023

(30) Foreign Application Priority Data
Feb. 1, 2022 (DE) .................... 102022102333.8

(51) Int. Cl.
*H01L 29/76* (2006.01)
*H01L 29/94* (2006.01)
(Continued)

(52) U.S. Cl.
CPC .......... *H10D 62/116* (2025.01); *H10D 30/65* (2025.01); *H10D 62/393* (2025.01); *H10D 64/117* (2025.01)

(58) Field of Classification Search
CPC .... H10D 62/116; H10D 30/65; H10D 62/393; H10D 64/117; H10D 64/111;
(Continued)

(56) References Cited

U.S. PATENT DOCUMENTS

2009/0072308 A1 3/2009 Chen et al.
2011/0260247 A1 10/2011 Yang et al.
(Continued)

FOREIGN PATENT DOCUMENTS

CN 110323138 A 10/2019
WO 2021135265 A1 7/2021

OTHER PUBLICATIONS

Cha, Hanseob, et al., "0.18um 100V-rated BCD with Large Area Power LDMOS with ultra-low effective Specific Resistance", Proceedings of the 2016 28th International Symposium on Power Semiconductor Devices and ICs (ISPSD), Prague, Czech Republic, Jun. 12-16, 2016, pp. 423-426.
(Continued)

*Primary Examiner* — Theresa T Doan
(74) *Attorney, Agent, or Firm* — Murphy, Bilak & Homiller, PLLC

(57) ABSTRACT

A field effect transistor, FET, is proposed. The FET includes a source region of a first conductivity type that is electrically connected to a source electrode at a first surface of a semiconductor body. The FET further includes a drain region of the first conductivity type that is electrically connected to a drain electrode at the first surface. A dielectric structure is arranged between the source region and the drain region along a first lateral direction. The dielectric structure includes a gate dielectric on the first surface and a field dielectric structure having a bottom side below the first surface. The FET further includes a gate electrode on the gate dielectric. The gate electrode and the field dielectric structure are spaced from each other along the first lateral direction. The FET further includes a field electrode having a bottom side below a top side of the field dielectric structure.

22 Claims, 3 Drawing Sheets

(51) Int. Cl.
  *H10D 30/65* (2025.01)
  *H10D 62/10* (2025.01)
  *H10D 62/17* (2025.01)
  *H10D 64/00* (2025.01)

(58) Field of Classification Search
  CPC .. H10D 64/112; H10D 62/126; H10D 62/109; H10D 62/157; H10D 64/516
  USPC .......................................................... 257/339
  See application file for complete search history.

(56) References Cited

U.S. PATENT DOCUMENTS

| | | |
|---|---|---|
| 2014/0339632 A1 | 11/2014 | Yu |
| 2016/0336410 A1 | 11/2016 | Hsiao et al. |
| 2017/0104097 A1 | 4/2017 | Park |
| 2017/0250277 A1* | 8/2017 | Wu ................. H10D 30/655 |
| 2021/0020779 A1 | 1/2021 | Lian et al. |
| 2021/0296451 A1* | 9/2021 | Chen ................. H10D 62/393 |

OTHER PUBLICATIONS

Fujii, Hiroki, et al., "A 90nm Bulk BiCDMOS Platform Technology with 15-80V LD-MOSFETs for Automotive Applications", Proceedings of the 29th International Symposium on Power Semiconductor Devices & ICs, Sapporo, pp. 73-76.

Fujii, Hiroki, et al., "A Recessed Gate LDMOSFET for Alleviating HCI Effects", Proceedings of the 2016 28th International Symposium on Power Semiconductor Devices and ICs (ISPSD), Prague, Czech Republic, Jun. 12-16, 2016, pp. 167-170.

Huang, Tsung-Yi, et al., "A Novel 80V HS-DMOS with Gradual-RESURF Profila to Reduce Ron_sp for High-Side Operation", Proceedings of the 29th International Symposium on Power Semiconductor Devices and ICs, Sapporo, pp. 299-302.

Jin, Feng, et al., "Best-in-Class LDMOS with Ultra-Shallow Trench Isolation and P-Buried Layer from 18V to 40V in 0.18um BCD Technology", Proceedings of The 29th International Symposium on Power Semiconductor Devices and ICs, Sapporo, pp. 295-298.

Liu, Hsin-Liang, et al., "A novel high-voltage LDMOS with shielding-contact structure for HCI SOA enhancement", Proceedings of the 29th International Symposium on Power Semiconductor Devices and IC's (ISPSD); May 28-Jun. 1, 2017, Sapporo, Japan, pp. 311-314.

Sakai, Atsushi, et al., "Simple and efficient approach to improve hot carrier immunity of a P-LDMOSFET", Proceedings of The 29th International Symposium on Power Semiconductor Devices and ICs, Sapporo, pp. 327-330.

Schmidt, Carsten, et al., "Increasing Breakdown Voltage of P-Channel LDMOS in BCD Technology with Novel Backside Process", Proceedings of The 29th International Symposium on Power Semiconductor Devices and ICs, Sapporo, pp. 339-342.

Wei, Lin, et al., "A Novel Contact Field Plate Application in Drain-Extended-MOSFET Transistors", Proceedings of The 29th International Symposium on Power Semiconductor Devices and ICs, Sapporo, pp. 335-337.

* cited by examiner

FIELD EFFECT TRANSISTOR HAVING A DIELECTRIC STRUCTURE

TECHNICAL FIELD

The present disclosure is related to a semiconductor device, in particular to a field effect transistor, FET, comprising a dielectric structure.

BACKGROUND

Technology development of new generations of semiconductor devices, e.g. field effect transistors (FETs), aims at improving electric device characteristics and reducing costs by shrinking device geometries. Although costs may be reduced by shrinking device geometries, a variety of tradeoffs and challenges have to be met when increasing device functionalities per unit area. For example, a trade-off between area-specific on-state resistance, $R_{on}xA$, switching efficiency and reliability requirements influenced by, for example, hot carrier induced, HCI, effects requires design optimization.

Thus, there is a need for an improved field effect transistor.

SUMMARY

An example of the present disclosure relates to a field effect transistor, FET. The FET includes a source region of a first conductivity type that is electrically connected to a source electrode at a first surface of a semiconductor body. The FET further includes a drain region of the first conductivity type that is electrically connected to a drain electrode at the first surface. The FET further includes a dielectric structure between the source region and the drain region along a first lateral direction. The dielectric structure includes a gate dielectric on the first surface, and a field dielectric structure having a bottom side below the first surface. The FET further includes a gate electrode on the gate dielectric. The gate electrode and the field dielectric structure are spaced from each other along the first lateral direction. The FET further includes a field electrode having a bottom side below a top side of the field dielectric structure.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor devices and together with the description serve to explain principles of the examples. Further examples are described in the following detailed description and the claims.

DETAILED DESCRIPTION

Figure 1:
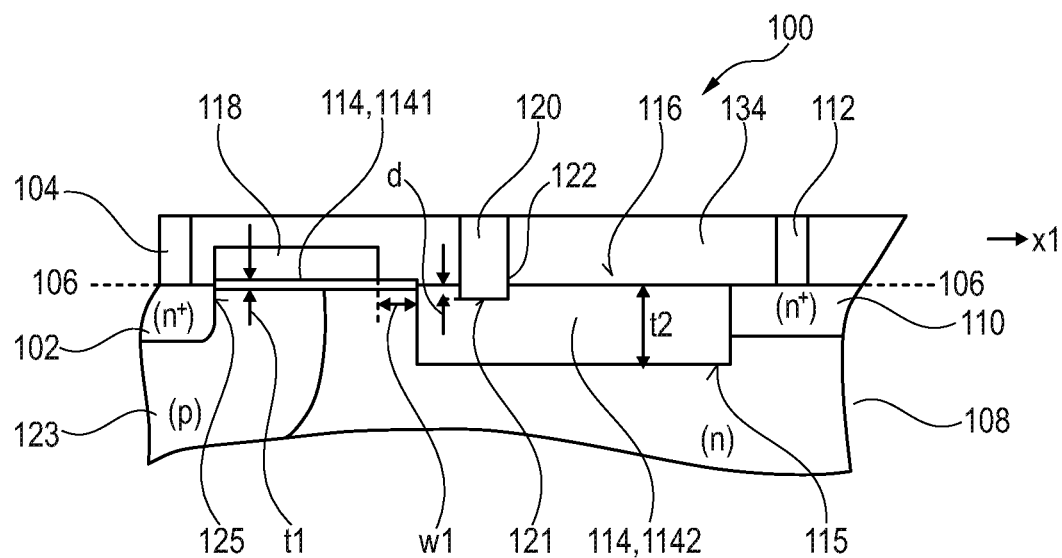
FIGS. 1 to 3 are partial cross-sectional views for illustrating examples of FETs including a field electrode extending into a recess of a field dielectric structure.

In the following detailed description, reference is made to the accompanying drawings, which form a part hereof and in which are shown by way of illustrations specific examples of FETs. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as $a \leq y \leq b$. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of a field effect transistor, FET, may include a source region of a first conductivity type that is electrically connected to a source electrode at a first surface of a semiconductor body. The FET may further include a drain region of the first conductivity type that is electrically connected to a drain electrode at the first surface. The FET may further include a dielectric structure between the source region and the drain region along a first lateral direction. The dielectric structure may include a gate dielectric on the first surface, and a field dielectric structure having a bottom side below the first surface. The FET may further include a gate electrode on the gate dielectric. The gate electrode and the field dielectric structure are spaced from each other along the first lateral direction. The FET may further include a field electrode having a bottom side below a top side of the field dielectric structure.

For example, the FET may be a lateral FET. In a lateral FET, a load current flow direction is a lateral direction, e.g. the first lateral direction, and the source region and the drain region are spaced from each other along the first lateral direction. For example, the lateral FET may be a laterally-diffused metal oxide semiconductor transistor, LDMOS transistor. In the LDMOS transistor, a channel region may be defined by a lateral diffusion offset between dopants of the source region and dopants of the body region that may first be introduced into the semiconductor body, e.g. by ion implantation, through a common mask. However, LDMOS transistors nowadays are typically manufactured by using different masks for introducing the dopants for the source region and the dopants for the body region. Hence, the channel region of the LDMOS transistor may also be defined by lithography.

For example, the FET may be a planar FET. Other than in trench FETs having the gate electrode arranged in a trench and having a channel current flowing along a sidewall of the trench, the gate electrode in the planar FET is planar and is arranged over the first surface of the semiconductor body. Thus, the channel current flows along the first surface in a channel region adjoining the gate dielectric at the first surface.

For example, the FET may be implemented monolithically using a mixed technology. Such mixed technologies can be used, for example, to form analog circuit blocks in a chip by the bipolar devices included in this technology for providing interfaces to digital systems, and to form digital circuit blocks by the complementary metal-oxide-semiconductor (CMOS) devices included in this technology for providing signal processing, and to form low-, medium- or high-voltage or power blocks by field effect transistors included in this technology. Such mixed technologies are known, for example, as bipolar CMOS-DMOS, BCD technologies or smart power technologies, SPT, and are used in a variety of application areas in the field of e.g. lighting, motor control, automotive electronics, power management for mobile devices, audio amplifiers, power supply, hard disks, printers. The FET 100 may be part of a BCD or Smart Power chip in one of the above application fields, for example.

The semiconductor body may be based on various semiconductor materials, for example silicon (Si), silicon-on-insulator (SOI), silicon-sapphire (SOS), silicon-germanium, germanium, gallium arsenide, silicon carbide, gallium nitride, or other compound semiconductor materials. The semiconductor body may be based on a semiconductor substrate, for example a semiconductor wafer and may include one or more epitaxial layers deposited thereon or may be back-thinned.

The first surface may be a front surface or a top surface of the semiconductor body, and the second surface may be a back surface or a rear surface of the semiconductor body, for example. The semiconductor body may be attached to a lead frame via the second surface, for example. Over the first surface of the semiconductor body, bond pads may be arranged and bond wires may be bonded on the bond pads, for example.

The source electrode and the drain electrode may be part of a wiring area over the semiconductor body. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric structure may be arranged. Contact plug(s) or contact line(s) may be formed in openings in the interlayer dielectric structure to electrically connect parts, e.g. metal lines or contact areas, of different wiring levels to one another. The source electrode may be formed by one or more elements of the wiring area. Likewise, the drain electrode may be formed by one or more elements of the wiring area. For example, the source electrode and the drain may include separate parts of a patterned first wiring level, e.g. a first metal layer.

The dielectric structure may include a plurality of merged parts that may differ in material, shape, and/or function, for example. For example, the merged parts of the dielectric structure may be formed by separate processes. For example, the merged parts of the dielectric structure may be parts that are merged along the first lateral direction. For example, the gate dielectric may be an insulating material such as an oxide, e.g., $SiO_2$, a nitride, e.g., $Si_3N_4$, a high-k dielectric, or a low-k dielectric, or any combination thereof. For example, the gate dielectric may be formed as a thermal oxide. The dielectric structure may include, for example, further parts in the direction of the drain electrode that are different from the gate dielectric in terms of material composition or geometric dimensions such as thickness. Examples of such further parts of the dielectric structure, e.g. the field dielectric structure, are presented in examples described further below. The bottom side of the field dielectric structure may have a smaller vertical distance to the second surface than the first surface. For example, the bottom side of the field dielectric structure may be located at a bottom side of a recess or trench in the semiconductor body. In this case, the field dielectric structure may be formed as a shallow trench isolation, STI. The bottom side of the field dielectric structure may also be a bottom side of an oxidized part of the semiconductor body, e.g. a bottom side of a local oxidation of silicon, LOCOS. On the dielectric structure, e.g. directly adjoining a top side of at least part of the dielectric structure, an interlayer dielectric structure may be arranged. The interlayer dielectric structure may be arranged between the dielectric structure and a first wiring level of the wiring area over the first surface of the semiconductor body. The first wiring level may be a wiring level of the wiring area that is closest to the first surface of the semiconductor body. The first wiring level may include separate parts, e.g. separate metal layer portions. The separate parts may include parts of the field electrode, the source electrode, or the drain electrode, for example.

The gate electrode may be formed of one or more conductive materials, e.g. metal, metal silicide, metal compound, highly doped semiconductor material such as highly doped polycrystalline silicon. For example, the gate electrode may be a single layer, e.g. a highly doped polycrystalline layer, or a stack of layers.

The gate electrode and the field dielectric structure may be spaced from each other along the first lateral direction by a lateral distance. Thus, the lateral distance defines the distance along the first lateral direction between a lateral end of gate electrode and a closest lateral end of the field dielectric structure. Since the gate electrode and the field dielectric structure are spaced from each other along the first lateral direction, the gate electrode and the field dielectric structure do not overlap. In other words, a lateral end part of the gate electrode is not arranged directly above a lateral end part of the field dielectric structure.

Similar to the gate electrode, the field electrode may be formed of one or more conductive materials, e.g. metal, metal silicide, metal compound, highly doped semiconductor material such as highly doped polycrystalline silicon. For example, the field electrode may be formed similar in shape and/or material to contact plugs or contact lines used to electrically connect an active area in the semiconductor body to a wiring level in the wiring area. The field electrode adjoins the field dielectric structure at a bottom side of the recess in the field dielectric structure. The bottom side of the recess is located below a top side of the field dielectric structure. Adjusting depth and position of the field electrode in the field dielectric structure allows for tuning an electric field profile below the field dielectric structure.

By combining one or more field electrodes in recesses of the field dielectric structure with a lateral spacing between the gate electrode and the field dielectric structure, an electric breakdown voltage between the source/body region and the drain region of the FET may be increased by improving the electric field distribution below the field dielectric structure. Thereby, HCl effects may be reduced and reliability of the FET may be improved.

For example, the field electrode may be electrically separated from the gate electrode. For example, the field electrode may be electrically connected to the source electrode. Alternatively, the field electrode may be electrically connected to a reference voltage. The reference voltage may be supplied by a voltage divider or by a reference voltage supply, for example.

For example, the FET may further include a body region of a second conductivity type and a deep body region of the second conductivity type. The body region may be arranged between the gate dielectric and the deep body region. For example, the body region and the source region may be electrically short-circuited, e.g. by being connected to the source electrode. A channel region having a conductivity that can be controlled by applying a suitable voltage to the gate electrode may be formed in a portion of the body region at the first surface that overlaps with the gate dielectric and the gate electrode. A channel current flowing along the first lateral direction parallel to the first surface can thus be controlled along the channel region. For example, in a self-blocking n-channel FET, i.e., an enhancement-type n-channel FET, a conductive channel is formed if a positive voltage between the gate electrode and the source electrode exceeds a threshold voltage Vth. In this case, the channel returns to a blocking state if the gate electrode falls below the threshold voltage, e.g. at a gate voltage of 0V. The deep body region and the body region may merge.

For example, the FET may further include a drain extension region of the first conductivity type between the source region and the drain region. The drain extension region may be adapted to a drain-to-source breakdown voltage in a range from 5V to 200V. The desired voltage blocking range may be set by suitable dimensioning and doping of the drain extension region. Thus, the FET can be used, for example, in circuit applications such as DC-DC converters. For realize a desired current carrying capacity, the FET may be designed by a plurality of parallel-connected FET cells. The parallel-connected FET cells may, for example, be field-effect transistor cells formed in the shape of a strip or a strip segment. Of course, the FET cells can also have any other shape, e.g., circular, elliptical, polygonal such as octahedral.

For example, the deep body region and the drain extension region may partially overlap along the first lateral direction. The deep body region may be electrically connected to the source electrode and may extend laterally below the drain extension region. The partial overlap has a positive effect on the blocking capability of the FET due to the compensation principle or RESURF (REduced SURface Field) principle. For example, the extension of the deep body region in the first lateral direction and an extension of the gate electrode in the first lateral direction may also overlap.

For example, the dielectric structure may further include a planar dielectric on the first surface. The planar dielectric may be arranged between the gate dielectric and the field dielectric structure along the first lateral direction. The planar dielectric may have a larger thickness than the gate dielectric. For example, a bottom side of the gate dielectric may be arranged at a same vertical level as a bottom side of the planar dielectric. A top side of the gate dielectric and a top side of the planar dielectric may merge via a step, for example.

For example, a thickness of the planar dielectric may exceed a thickness of the gate dielectric by 100% to 600%. In some other examples, the thickness of the planar dielectric may even exceed the thickness of the gate dielectric by 700% or even more. For example, the thickness of the planar dielectric may be larger than the thickness of the gate dielectric by 10 nm or even more.

For example, the gate electrode may be arranged on at least part of the planar dielectric. For example, less than 50%, or less than 40%, or less than 30% of the planar dielectric may be covered by the gate electrode, for example.

For example, the planar dielectric may directly adjoin the field dielectric structure at a first lateral end. The planar dielectric may also directly adjoin the gate dielectric at a second lateral end opposite to the first lateral end. Thus, apart from the planar dielectric, no more dielectrics may be laterally arranged between the gate dielectric and the field dielectric structure, for example.

For example, a depth of a recess in the field dielectric structure may range from 5% to 50% of a thickness of the field dielectric structure. For example, the recess may be located closer to a lateral end of field dielectric structure that is directed toward the source electrode than to a lateral end of field dielectric structure that is directed toward the drain electrode. The recess may be filled with a part of the field electrode, for example.

For example, the FET may include a plurality of field electrodes including the field electrode. At least some of the plurality of field electrodes may be spaced from one another along the first lateral direction. The plurality of field electrodes may be arranged in a two-dimensional pattern. For example, the plurality of field electrodes may be arranged in a checkerboard pattern. This may be beneficial with respect to a tradeoff between a compact design and minimum design rules of the technology used for fabricating the FET.

For example, an extension depth of the plurality of field electrodes into the field dielectric structure may decrease with a decreasing lateral distance to the drain electrode. This may allow for a further design option for optimizing the electric field profile, and may thus allow for a further increase in the drain-to-source breakdown voltage, for example.

For example, the field electrode may be a contact plug or a contact line. The field electrode may include a material that differs from a material of the gate electrode. For example, the field electrode may be concurrently formed with parts of the wiring area, e.g. with contact plugs electrically connection wiring levels to active area in the semiconductor body.

For example, the FET may further include an accumulation region of the first conductivity type. The accumulation region may be arranged between the field dielectric structure and a body region along the first lateral direction. The accumulation region may be arranged between the first surface and the drain extension region along a vertical direction. For example, at least part of the accumulation may be arranged directly below the planar dielectric. For example, a lateral end of the accumulation region may directly adjoin the field dielectric structure. A bottom side of the accumulation region may have a smaller vertical distance to the first surface than a bottom side of field dielectric structure. For example, the accumulation region may only be partially covered by the gate electrode.

For example, the accumulation region may be defined by at least one first vertical concentration profile of dopants of the first conductivity type. The drain extension region may be defined by at least one second vertical concentration profile of dopants of the first conductivity type. The at least one first vertical concentration profile and the at least one second vertical concentration profile may intersect at a vertical transition between the accumulation region and the drain extension region.

For example, a dose of dopants defining the at least one first vertical concentration profile of dopants may range between $1\times10^{16}$ cm$^{-3}$ and $1\times10^{18}$ cm$^{-3}$, or between $1\times10^{17}$ cm$^{-3}$ to $2\times10^{17}$ cm$^{-3}$. Provision of the accumulation region may allow for a reduction of the area-specific on-state resistance $R_{on}XA$ and an improvement of HCl robustness, for example.

For example, the vertical transition between the at least one first vertical concentration profile and the at least one second vertical concentration profile may be arranged between a bottom side of the field dielectric structure and the first surface.

The examples and features described above and below may be combined.

Functional and structural details described with respect to the examples above shall likewise apply to the exemplary examples illustrated in the figures and described further below.

In the following, further examples of field effect transistors, FETs, are explained in connection with the accompanying drawings. Functional and structural details described with respect to the examples above shall likewise apply to the exemplary embodiments illustrated in the figures and described further below. In the illustrated examples, the first conductivity is n-type and the second conductivity type is p-type for an n-channel FET. However, the first conductivity type may also be p-type and the second conductivity type may be n-type for a p-channel FET.

FIG. 1 schematically and exemplarily shows a FET 100. The FET 100 includes an n$^+$-doped source region 102 that is electrically connected to a source electrode 104 at a first surface 106 of a semiconductor body 108. The source electrode 104 is illustrated in simplified form and may include a plurality of elements of a wiring area, e.g. a combination of parts of patterned wiring levels, e.g. metal layers, contact plugs or lines and vias.

The FET 100 further includes an n$^+$-doped drain region 110 that is electrically connected to a drain electrode 112 at the first surface 106. Similar to the source electrode 104, the drain electrode 112 is illustrated in simplified form and may include a plurality of elements of a wiring area, e.g. a combination of parts of patterned wiring levels, e.g. metal layers, contact plugs or lines and vias.

The FET 100 includes a dielectric structure 114 between the n$^+$-doped source region 102 and the n$^+$-doped drain region 110 along a first lateral direction x1. The dielectric structure 114 includes a plurality of merged parts. As is illustrated in the example of FIG. 1, the dielectric structure 114 includes a gate dielectric 1141 on the first surface 106. The dielectric structure 114 also includes a field dielectric structure 1142 having a bottom side 115 below the first surface 104.

The FET 100 further includes a gate electrode 118 on the gate dielectric 1141. The gate electrode 118 and the field dielectric structure 1142 are spaced from each other along the first lateral direction x1 by a lateral distance w1. This spacing defines part of an accumulation region within the semiconductor body 108 that is not covered by the gate electrode. In other words, the gate electrode is absent above, i.e. in the vertical direction toward the wiring area, this part of the accumulation region. More general, in one example, this spacing defines a part of the semiconductor body 108 where the first surface 106 is not covered by the gate electrode 118.

The FET 100 further includes a field electrode 120 filling a recess 122 in the field dielectric structure 1142. A depth d of the recess 122 may range from 5% to 50% of a thickness t2 of the field dielectric structure 1142, for example.

In the example of FIG. 1, the field dielectric structure 1142 is formed as a shallow trench isolation, STI. In other examples, the field dielectric structure 1142 may be formed as another dielectric, e.g. as a local oxidation of silicon, LOCOS. The field electrode 120 may be electrically separated from the gate electrode 118, e.g. the field electrode 120 may be electrically connected to the source electrode 104, or to a voltage divider, or to a reference voltage circuit, for example.

The FET 100 further includes a p-doped body region 123. A top part of the body region 123 adjoining the gate dielectric 1141 defines a channel region 125 of the FET 100. The channel region 125 can be controlled with respect to conductivity by a voltage applied to the gate electrode 118.

Figure 2:
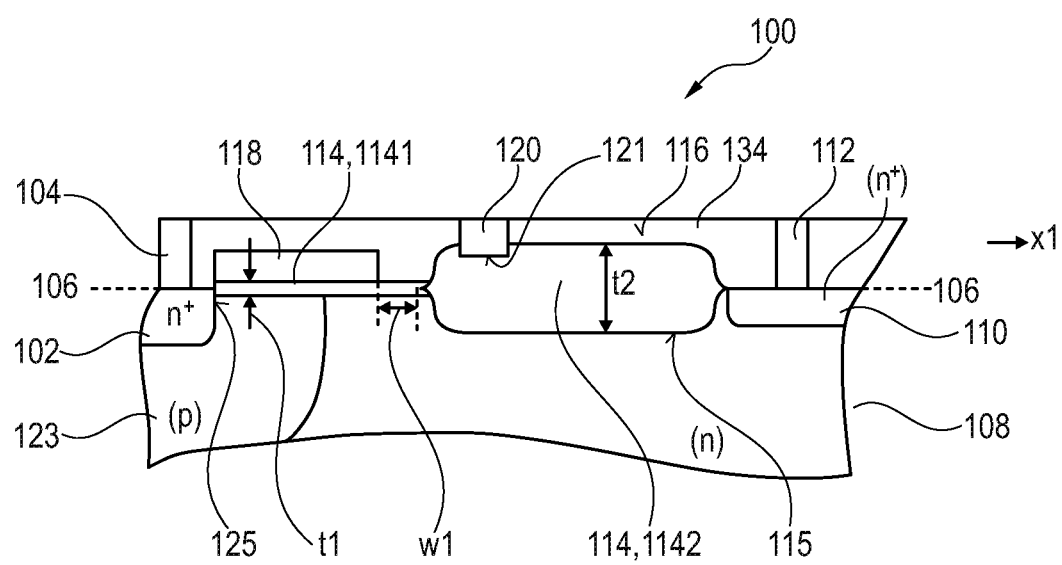

FIG. 2 schematically and exemplarily shows a FET 100 that is similar to FET 100 of FIG. 1. However, in the FET 100 of the example illustrated in FIG. 2, the field dielectric structure 1142 is formed as a local oxidation of silicon, LOCOS instead of the STI illustrated in FIG. 1.

Figure 3:
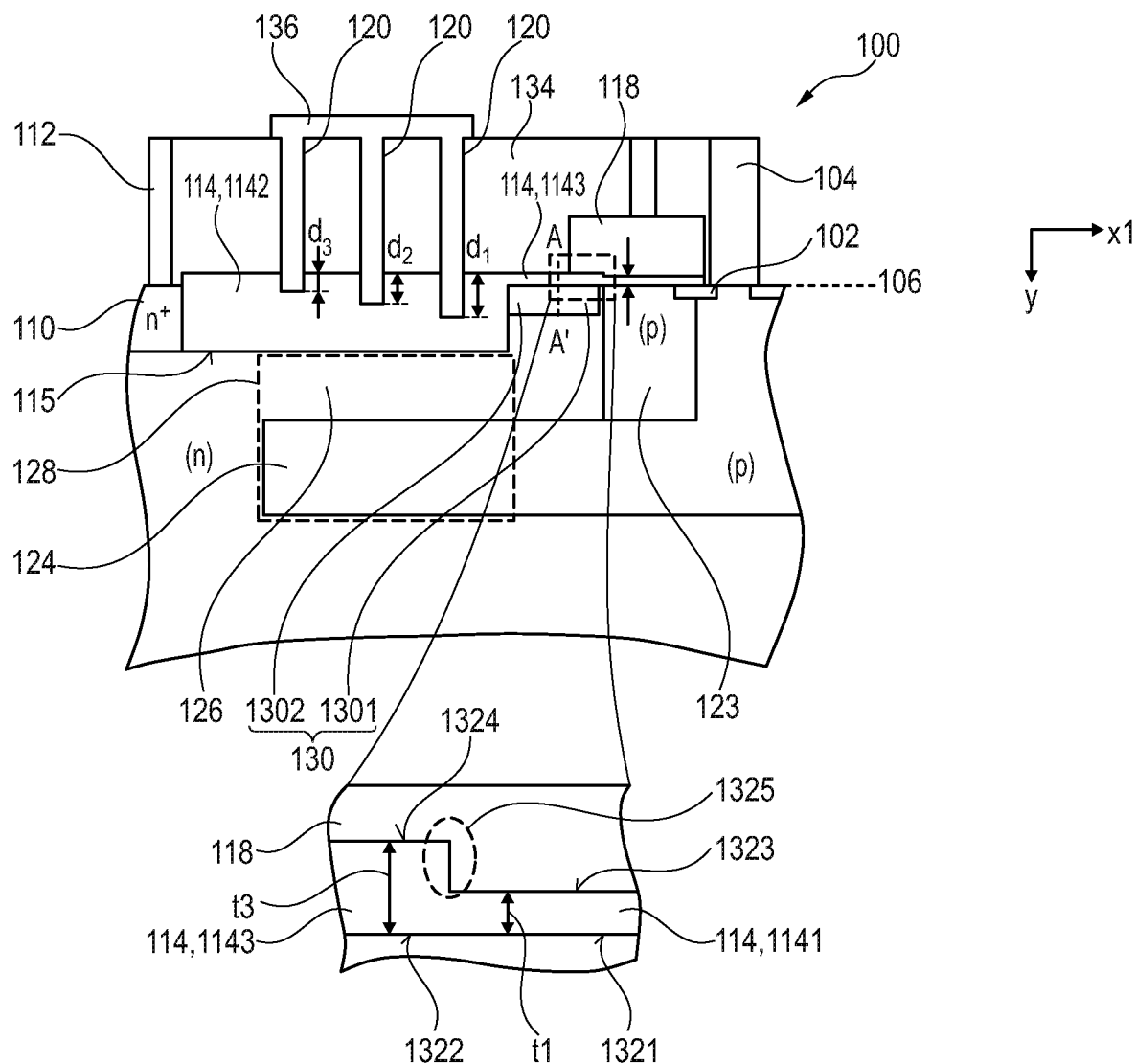

Further exemplary details of the FET 100 of FIG. 1 are illustrated in the schematic cross-sectional view of FIG. 3. The FET 100 in FIG. 3 includes a p-doped deep body region 124. The body region 123 is arranged between the gate dielectric 1141 and the deep body region 124. The deep body region 124 and the field dielectric structure 1142 partially overlap along the first lateral direction x1.

The FET 100 further includes an n-doped drain extension region 126 between the source region 102 and the drain region 110. The drain extension region 126 may be adapted to a drain-to-source breakdown voltage in a range from 5V to 200V by suitable dimensioning and doping of the drain extension region 126. The deep body region 124 and the drain extension region 126 partially overlap along the first lateral direction x1 in an overlap region 128. The deep body region 124 is electrically connected to the source electrode 104, e.g. via a highly doped body contact region and/or via the body region 123, and extends laterally below the drain extension region 126. In the example of FIG. 3, the extension of the deep body region 124 in the first lateral direction x1 and an extension of the gate electrode 118 in the first lateral direction x1 also overlap.

In the exemplary FET 100 illustrated in FIG. 3, see also the magnified area, the dielectric structure 114 further includes a planar dielectric 1143 on the first surface 106. The planar dielectric 1143 is arranged between the gate dielectric 1141 and the field dielectric structure 1142 along the first lateral direction x1. A thickness t3 of the planar dielectric 1143 is larger than a thickness t1 of the gate dielectric 1141. In the exemplary FET 100 illustrated in FIG. 3, a bottom side 1321 of the gate dielectric 1141 is arranged at a same vertical level as a bottom side 1322 of the planar dielectric 1143. A top side 1323 of the gate dielectric 1141 and a top side 1324 of the planar dielectric 1143 merge via a step 1325. The gate electrode 118 is also arranged on a part of the planar dielectric 1143. In the exemplary FET 100 illustrated in FIG. 3, the planar dielectric 1143 directly adjoins the field dielectric structure 1142 at a first lateral end. The planar dielectric 1143 also directly adjoins the gate dielectric 1141 at a second lateral end opposite to the first lateral end.

The exemplary FET 100 illustrated in FIG. 3 further includes a plurality of field electrodes 120. At least some of the plurality of field electrodes 120 are spaced from each other along the first lateral direction x1. As is illustrated in the exemplary FET 100 of FIG. 3, extension depths d1, d2, d3 of the plurality of field electrodes 120 into the field dielectric structure 1142 decrease with decreasing lateral distance to the drain electrode 112, i.e. d3<d2<d1. The field electrodes 120 are electrically interconnected by a part of a first wiring level 136.

The exemplary FET 100 illustrated in FIG. 3 further includes an n-doped accumulation region 130 arranged between the field dielectric structure 1142 and the body region 123 along the first lateral direction x1. The n-doped accumulation region 130 is further arranged between the first surface 106 and the drain extension region 126 along a vertical direction y. A first part 1301 of the n-doped accumulation region 130 is covered by the gate electrode 118 and a second part 1302 of the n-doped accumulation region 130 is not covered by the gate electrode 118. Thus, the n-doped accumulation region 130 is only partially covered by the gate electrode 118.

Figure 4:
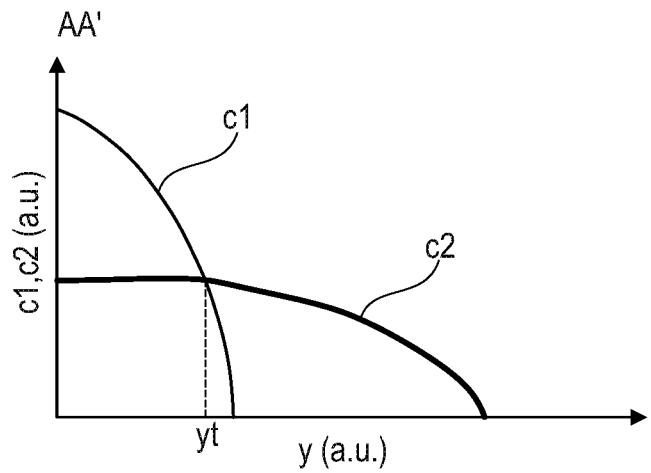
FIG. 4 is a schematic graph for illustrating vertical doping concentration profiles along line AA' of FIG. 3.

The schematic graph of FIG. 4 refers to line AA' of FIG. 3 and illustrates a first vertical concentration profile c1 of n-type dopants defining the accumulation region 130, and a second vertical concentration profile c2 of n-type defining the drain extension region 126. The first vertical concentration profile c1 and the second vertical concentration profile c2 intersect at a vertical transition yt between the accumulation region 130 and the drain extension region 126. The vertical transition is arranged between a bottom side 115 of the field dielectric structure 1142 and the first surface 106.

Figure 5:
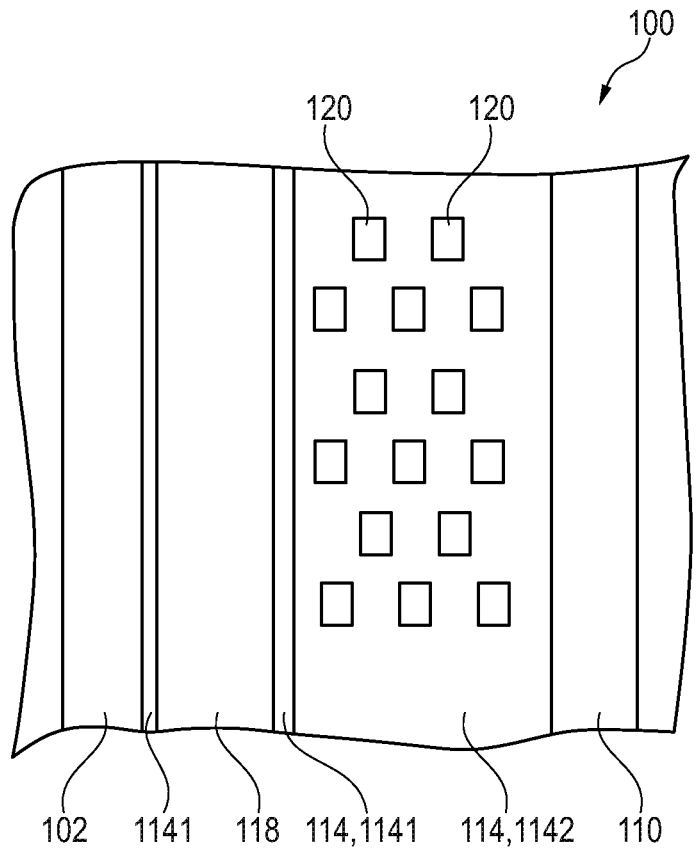
FIG. 5 is a schematic top view for illustrating an exemplary arrangement of field electrodes on the field dielectric structure.

The schematic top view of FIG. 5 is an illustration of an arrangement of the field electrodes 120 on the field dielectric structure 1142. The plurality of field electrodes may be arranged in a two-dimensional pattern. In the example of FIG. 5, the plurality of field electrodes 120 are arranged in a checkerboard pattern.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A field effect transistor (FET), comprising:
    a source region of a first conductivity type that is electrically connected to a source electrode at a first surface of a semiconductor body;
    a drain region of the first conductivity type that is electrically connected to a drain electrode at the first surface;
    a dielectric structure between the source region and the drain region along a first lateral direction, the dielectric structure including a gate dielectric on the first surface and a field dielectric structure having a bottom side below the first surface;
    a gate electrode on the gate dielectric, wherein the gate electrode and the field dielectric structure are spaced from each other along the first lateral direction; and
    a field electrode having a bottom side below a top side of the field dielectric structure.

2. The FET of claim 1, further comprising an interlayer dielectric structure arranged between the dielectric structure and a first wiring level of a wiring area over the first surface of the semiconductor body, the first wiring level being a wiring level of the wiring area that is closest to the first surface of the semiconductor body.

3. The FET of claim 1, wherein the field electrode is electrically separated from the gate electrode.

4. The FET of claim 1, wherein the field dielectric structure is a shallow trench isolation (STI) or a local oxidation of silicon (LOCOS).

5. The FET of claim 4, wherein the field dielectric structure is the STI and the bottom side of the field electrode is located below the first surface.

6. The FET of claim 1, wherein the field electrode is electrically connected to the source electrode.

7. The FET of claim 1, further comprising a body region of a second conductivity type and a deep body region of the second conductivity type, wherein the body region is arranged between the gate dielectric and the deep body region, and wherein the deep body region and the field dielectric structure partially overlap along the first lateral direction.

8. The FET of claim 1, further comprising a drain extension region of the first conductivity type between the source region and the drain region, wherein the drain extension region is adapted to a drain-to-source breakdown voltage in a range from 5V to 200V.

9. The FET of claim 8, wherein the deep body region and the drain extension region partially overlap along the first lateral direction.

10. The FET of claim 1, wherein the dielectric structure further includes a planar dielectric on the first surface, the planar dielectric being arranged between the gate dielectric and the field dielectric structure along the first lateral direction and having a larger thickness than the gate dielectric.

11. The FET of claim 10, wherein a thickness of the planar dielectric exceeds a thickness of the gate dielectric by 100% to 600%.

12. The FET of claim 10, wherein the gate electrode is arranged on at least a part of the planar dielectric.

13. The FET of claim 10, wherein the planar dielectric directly adjoins the field dielectric structure at a first lateral end, and directly adjoins the gate dielectric at a second lateral end opposite to the first lateral end.

14. The FET of claim 1, wherein a depth of a recess in the field dielectric structure ranges from 5% to 50% of a thickness of the field dielectric structure.

15. The FET of claim 1, further comprising a plurality of field electrodes including the field electrode, wherein at least some of the plurality of field electrodes are spaced from one another along the first lateral direction.

16. The FET of claim 15, wherein an extension depth of the plurality of field electrodes into the field dielectric structure decreases with decreasing lateral distance to the drain electrode.

17. The FET of claim 1, wherein the field electrode is a contact plug or a contact line, and includes a material that differs from a material of the gate electrode.

18. The FET of claim 1, further comprising an accumulation region of the first conductivity type, wherein the accumulation region is arranged between the field dielectric structure and the body region along the first lateral direction.

19. The FET of claim 18, wherein the accumulation region is only partially covered by the gate electrode.

20. The FET of claim 19, wherein the accumulation region is defined by at least one first vertical concentration profile of dopants of the first conductivity type, and the drain extension region is defined by at least one second vertical concentration profile of dopants of the first conductivity type, and wherein the at least one first vertical concentration profile and the at least one second vertical concentration profile intersect at a vertical transition between the accumulation region and the drain extension region.

21. The FET of claim 20, wherein a dose of dopants defining the at least one first vertical concentration profile of dopants ranges from $1\times10^{16}$ cm$^{-3}$ to $1\times10^{18}$ cm$^{-3}$.

22. The FET of claim 20, wherein the vertical transition is arranged between a bottom side of the field dielectric structure and the first surface.

* * * * *